US012805398B2

(12) United States Patent
Lee

(10) Patent No.: US 12,805,398 B2
(45) Date of Patent: Nov. 17, 2026

(54) SEMICONDUCTOR PACKAGE

(71) Applicant: SK hynix Inc., Icheon-si (KR)

(72) Inventor: Seong Ju Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 332 days.

(21) Appl. No.: 18/409,195

(22) Filed: Jan. 10, 2024

(65) Prior Publication Data

US 2025/0062283 A1 Feb. 20, 2025

Related U.S. Application Data

(60) Provisional application No. 63/520,571, filed on Aug. 18, 2023.

(51) Int. Cl.

| | |
|---|---|
| ***H10W 90/00*** | (2026.01) |
| ***H10B 80/00*** | (2026.01) |
| ***H10W 72/00*** | (2026.01) |
| ***H10W 72/50*** | (2026.01) |
| ***H10W 72/90*** | (2026.01) |
| ***H10W 80/00*** | (2026.01) |

(Continued)

(52) U.S. Cl.

CPC ............ *H10W 90/00* (2026.01); *H10B 80/00* (2023.02); *H10W 72/01* (2026.01); *H10W 72/5445* (2026.01); *H10W 72/865* (2026.01); *H10W 72/884* (2026.01); *H10W 72/9445* (2026.01); *H10W 72/967* (2026.01); *H10W 80/743* (2026.01); *H10W 90/20* (2026.01); *H10W 90/24* (2026.01); *H10W 90/732* (2026.01); *H10W 90/734* (2026.01); *H10W 90/752* (2026.01); *H10W 90/754* (2026.01)

(58) Field of Classification Search

CPC . H10W 90/00; H10W 72/01; H10W 72/5445; H10W 72/865; H10W 72/884; H10W 72/9445; H10W 72/967; H10W 80/743; H10W 90/20; H10W 90/24; H10W 90/732; H10W 90/734; H10W 90/752; H10W 90/754; H10W 72/50; H10W 72/90; H10W 20/20; H10W 20/40; H10W 72/00; H10W 72/20; H10W 90/701; H10B 80/00

See application file for complete search history.

(56) References Cited

U.S. PATENT DOCUMENTS

| | | | |
|---|---|---|---|
| 2002/0190360 | A1 | 12/2002 | Poulin |
| 2011/0063925 | A1 | 3/2011 | Mizukane et al. |
| 2020/0075521 | A1 | 3/2020 | Elsherbini et al. |

(Continued)

FOREIGN PATENT DOCUMENTS

| | | | |
|---|---|---|---|
| KR | 1020110129149 | A | 12/2011 |
| KR | 1020130109791 | A | 10/2013 |
| KR | 1020190093377 | A | 8/2019 |

*Primary Examiner* — Julia Slutsker

(74) *Attorney, Agent, or Firm* — WILLIAM PARK AND ASSOCIATES LTD.

(57) ABSTRACT

A semiconductor package includes a substrate; a first chip and a second chip stacked on the substrate, each including a first pad, a cell region, a first level serializer-deserializer connected to the first pad, a second level serializer-deserializer connected between the first level serializer-deserializer and the cell region and a second pad that is connected to a node between the first level serializer-deserializer and the second level serializer-deserializer; and a first connection member connecting the second pad of the first chip to the second pad of the second chip.

49 Claims, 14 Drawing Sheets

(51) Int. Cl.
*H10W 90/20* (2026.01)
*H10W 90/24* (2026.01)

(56) References Cited

U.S. PATENT DOCUMENTS

2020/0393916 A1 12/2020 Kim et al.
2023/0121992 A1 * 4/2023 Kim ....................... H10B 80/00
365/191

* cited by examiner

SEMICONDUCTOR PACKAGE

CROSS-REFERENCES TO RELATED APPLICATION

The present application claims the benefit under 35 U.S.C. § 119(e) of U.S. Provisional application No. 63/520,571, filed on Aug. 18, 2023, which is incorporated herein by reference in its entirety.

BACKGROUND

1. Technical Field

Various embodiments generally relate to a semiconductor package having a chip stack structure.

2. Related Art

In accordance with the demand for high integration, the degree of integration has been improved through a scale-down method of reducing line widths, but as the scale-down technology reaches its limits, a chip stack structure has been attracting attention.

The chip stack structure includes a plurality of chips stacked each other. The plurality of chips in the chip stack structure may transmit and receive signals to and from other device through bonding wire.

SUMMARY

In an embodiment, a semiconductor package may include: a substrate; a first chip and a second chip stacked on the substrate, each including a first pad, a cell region, a first level serializer-deserializer connected to the first pad, a second level serializer-deserializer connected between the first level serializer-deserializer and the cell region and a second pad that is connected to a node between the first level serializer-deserializer and the second level serializer-deserializer; and a first connection member connecting the second pad of the first chip to the second pad of the second chip.

In an embodiment, a semiconductor package may include: a first chip disposed on a substrate, the first chip including an external data pad, a first slice data pad and a first level serializer-deserializer connected between the external data pad and the first slice data pad; a second chip stacked on the first chip, the second chip including a second slice data pad and a second level serializer-deserializer connected to the second slice data pad; and a first connection member connecting the first slice data pad and the second slice data pad.

In an embodiment, a semiconductor package may include: a substrate; first and second chips stacked on the substrate, each including an external signal pad that is included in a first pad column located in a first edge portion and a slice signal pad that is included in a second pad column located in the first edge portion; a first connection member connecting the slice signal pad of the first chip to the slice signal pad of the second chip; and a second connection member connecting the substrate to the external signal pad of the first chip, wherein, in each of the first and second chips, the first pad column is disposed between a chip side surface included in the first edge portion and the second pad column.

In an embodiment, a semiconductor package may include: a substrate; a first chip stacked on the substrate, the first chip including an external signal pad that is included in a first pad column located in a first edge portion and a first slice signal pad that is included in a second pad column located in the first edge portion; a second chip stacked on the first chip, the second chip including a second slice signal pad; a first connection member connecting the first slice signal pad to the second slice signal pad; and a second connection member connecting the substrate to the external signal pad, wherein the first pad column is disposed between a side surface of the first chip included in the first edge portion and the second pad column.

DETAILED DESCRIPTION

Figure 1:
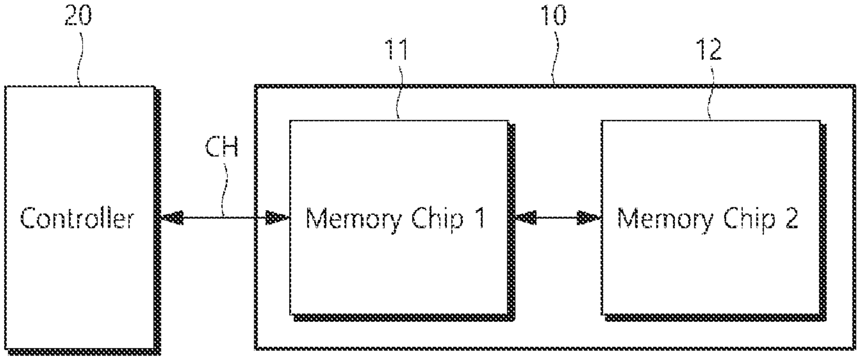
FIG. 1 is a block diagram of a memory system including a semiconductor package based on an embodiment of the disclosed technology.

Hereinafter, embodiments of the present disclosure will be described in detail with reference to the accompanying drawings. In the following description, the same elements will be designated by the same reference numerals although they are shown in different drawings. Further, in the following description of the present disclosure, a detailed description of known functions and configurations incorporated herein will be omitted when it may make the subject matter of the present disclosure rather unclear. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g., "a," "an" and "the," this may include a plural of that noun unless specifically stated otherwise.

Also, in describing the components of the disclosure, there may be terms used like first, second, A, B, (a), and (b). These are solely for the purpose of differentiating one component from another component but do not limit the substances, order, sequence or number of the components.

In descriptions for the positional relationships of components, in the case where it is described that at least two components are "connected," "coupled" or "linked," it is to be understood that the at least two components may be directly "connected," "coupled" or "linked" but may be indirectly "connected," "coupled" or "linked" with another component interposed between the two components. Here, another component may be included in at least one of the at least two components which are "connected," "coupled" or "linked" with each other.

In descriptions for time flow relationships of components, an operating method or a fabricating method, in the case where pre and post relationships in terms of time or pre and post relationships in terms of flow are described, for example, by "after," "following," "next" or "before," non-continuous cases may be included unless "immediately" or "directly" is used.

In the case where a numerical value for a component or its corresponding information (e.g., level, etc.) is mentioned, even though there is no separate explicit description, the numerical value or its corresponding information can be interpreted as including an error range that may be caused by various factors (for example, a process variable, an internal or external shock, noise, etc.).

Hereinafter, various embodiments of the disclosed technology will be described in detail with reference to the accompanying drawings.

Various embodiments are directed to providing a semiconductor package with a chip stack structure.

According to the embodiments, it is possible to fabricate a semiconductor package having a chip stack structure with a plurality of chips that can transmit and receive signals to and from other device through bonding wires.

FIG. 1 is a block diagram of a memory system including a semiconductor package based on an embodiment of the disclosed technology.

Referring to FIG. 1, a semiconductor package 10 may be connected to an external device 20 through a channel CH.

The external device 20 may control overall operations of the semiconductor package 10, for example, a read operation and a write operation, in response to a request of a host (not shown). The external device 20 may include a memory controller or a processor.

The semiconductor package 10 may include a first chip 11 and a second chip 12. Hereinafter, a case in which the semiconductor package 10 includes two semiconductor chips will be described, but the disclosed technology is not limited thereto. The semiconductor package 10 may include at least three semiconductor chips. Semiconductor chips included in the semiconductor package 10 may be referred to as slices.

The first and second chips 11 and 12 may include various types of memories. For example, each of the first and second chips 11 and 12 may include a dynamic random access memory (DRAM). However, the disclosed technology is not limited thereto, and each of the first and second chips 11 and 12 may include a volatile memory, such as an SRAM (static RAM) or a nonvolatile memory, such as a NAND flash, a resistive RAM (RRAM), a phase-change RAM (PRAM), a magnetoresistive RAM (MRAM) and a ferroelectric RAM (FRAM).

The first chip 11 may operate as a master chip, and the second chip 12 may operate as a slave chip. The first chip 11 and the second chip 12 may function in such a manner that they receive the same chip select signal and a specific layer of the first chip 11 and the second chip 12 may be accessed by an address signal. In another embodiment, the first chip 11 and the second chip 12 may function as different logical ranks.

The first chip 11 may be connected to the channel CH to interface with the external device 20 through the channel CH, may exchange data with the external device 20, and may receive a command, an address, and a clock from the external device 20.

The first chip 11 may be connected to the second chip 12 to interface with the second chip 12, may exchange data with the second chip 12, and may provide a command and an address to the second chip 12.

The first chip 11 may parallelize write data input from the external device 20. The first chip 11 may serialize data read from the first chip 11 or the second chip 12 and may output the data to the external device 20. The first chip 11 may generate an internal command by decoding a command input from the external device 20. The first chip 11 may generate an internal address by decoding an address input from the external device 20. The internal command may include an internal read command and an internal write command. The internal address may include a bank address, a row address and a column address.

The first chip 11 may output parallelized write data to the second chip 12 and may receive read data from the second chip 12. The first chip 11 may provide an internal command and an internal address to the second chip 12.

The second chip 12 may be connected to the first chip 11 to interface with the first chip 11. Only the first chip 11 may be connected to the channel CH, and the second chip 12 might not be connected to the channel CH. Only the first chip 11 may face the load of the channel CH and have a channel load, and the second chip 12 may be load-decoupled from the channel CH. Accordingly, as the loading factor of the semiconductor package 10 is maintained to be low, timing and bus speed may be improved, and data input/output speed may be improved. In addition, signal integrity may be improved, and power consumption may be reduced.

The disclosed technology proposes a semiconductor package in which signals are transmitted between slices using bonding wires.

Figure 2:
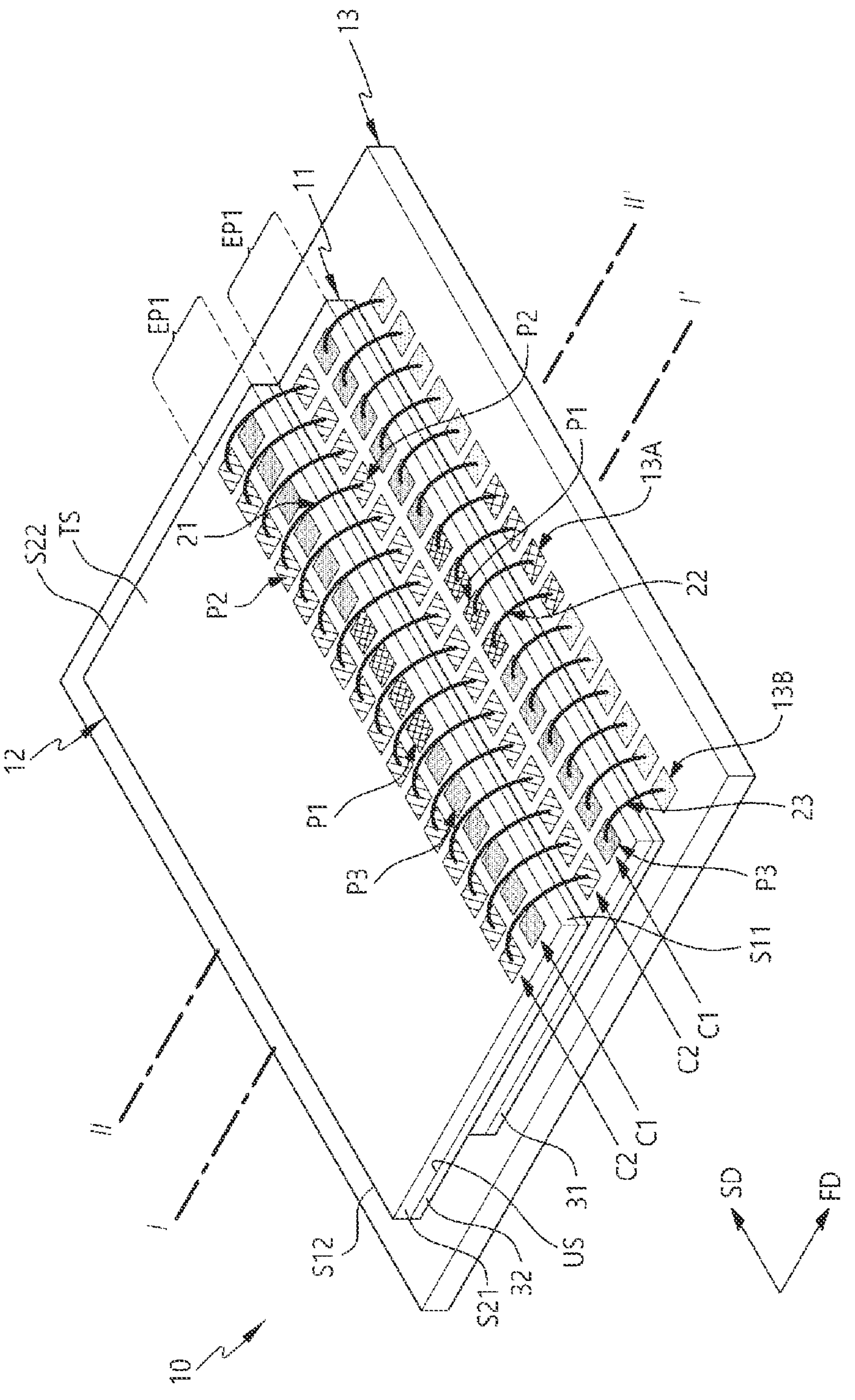
FIG. 2 is a perspective view of a semiconductor package based on an embodiment of the disclosed technology.
Figure 3:
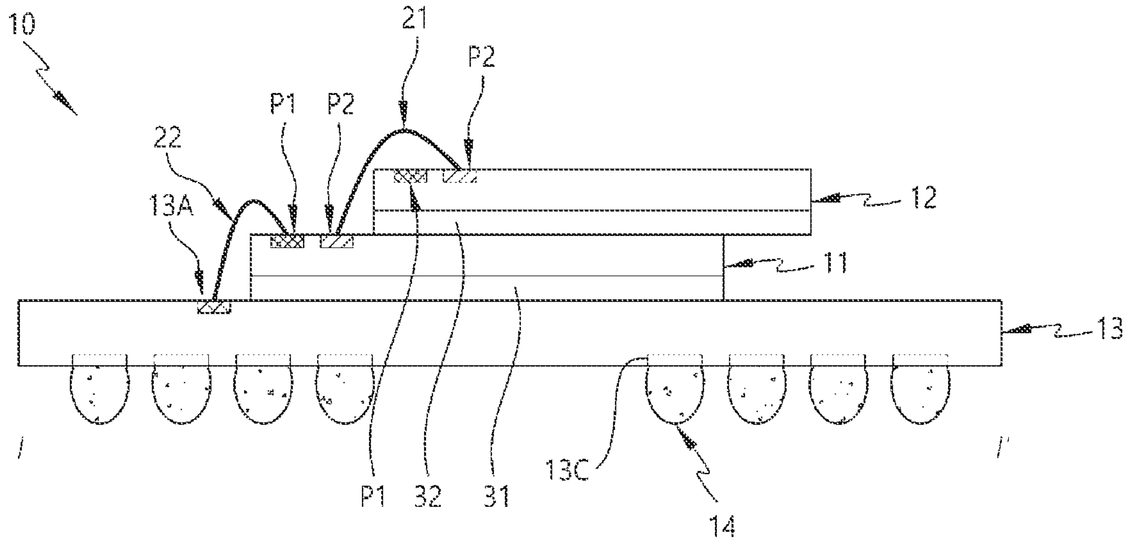
FIG. 3 is a cross-sectional view taken along the line I-I' of FIG. 2.
Figure 4:
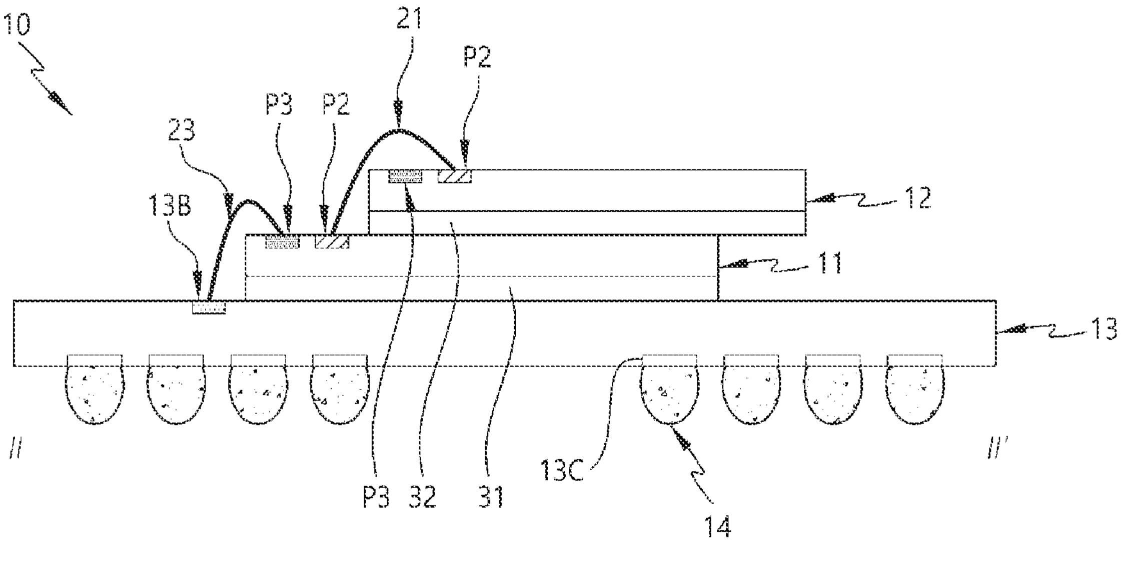
FIG. 4 is a cross-sectional view taken along the line II-II' of FIG. 2.

FIG. 2 is a perspective view of a semiconductor package based on an embodiment of the disclosed technology, FIG. 3 is a cross-sectional view taken along the line I-I' of FIG. 2, and FIG. 4 is a cross-sectional view taken along the line II-II' of FIG. 2.

Referring to FIGS. 2 to 4, a semiconductor package 10 may include a substrate 13, a first chip 11 and a second chip 12. The first and second chips 11 and 12 are stacked on the substrate 13.

The substrate 13 may include a circuit and/or wiring structure for electrically connecting the first chip 11 to an external device. For example, the substrate 13 may include a printed circuit board (PCB), an interposer, or a redistribution layer.

A plurality of top substrate pads 13A and 13B may be disposed on the top surface of the substrate 13. When the substrate 13 is connected to the first chip 11 through bonding wires, the top substrate pads 13A and 13B may include bond fingers. Bottom substrate pads 13C for connecting with external connection terminals 14 may be disposed on the bottom surface of the substrate 13. When the external connection terminals 14 are solder balls, the bottom substrate pads 13C may include ball lands. Each of the top substrate pads 13A and 13B may be electrically connected to a corresponding bottom substrate pad 13C through the circuit and/or wiring structure in the substrate 13.

The first chip 11 may be disposed on the substrate 13, and the second chip 12 may be disposed on the first chip 11. A first adhesive layer 31 may be disposed between the substrate 13 and the first chip 11 to attach the first chip 11 to the substrate 13. A second adhesive layer 32 may be disposed between the first chip 11 and the second chip 12 to attach the first chip 11 to the second chip 12.

The first chip 11 and the second chip 12 may have structures that are physically the same as each other. The first chip 11 and the second chip 12 may be the same type of chip. The first chip 11 and the second chip 12 may have the same size.

Each of the first and second chips 11 and 12 may have a top surface TS on which pads P1, P2, and P3 are disposed, a bottom surface US which is on the opposite side of the top surface TS, and side surfaces S11, S12, S21 and S22 that connect the top surface TS to the bottom surface US. The side surfaces S11, S12, S21 and S22 may include two side surfaces S11 and S12 that are on opposite sides of each other in a first direction FD parallel to the top surface of the substrate 13, and two side surfaces S21 and S22 that are on opposite sides of each other in a second direction SD parallel to the top surface of the substrate 13 and perpendicular to the first direction FD. Hereinafter, the two side surfaces S11 and S12 that are on opposite sides of each other in the first direction FD will be referred to as a first side surface S11 and a second side surface S12.

The pads P1, P2, and P3 may include a plurality of external signal pads P1, a plurality of slice signal pads P2, and a plurality of power pads P3.

The external signal pads P1 may include an external data pad, an external command/address (CA) pad, an external clock pad, and so on. The slice signal pads P2 may include a slice data pad, a slice command pad, a slice address pad, and so on. Optionally, the slice signal pads P2 may further include a slice power pad.

Each of the first and second chips 11 and 12 may include first and second pad columns C1 and C2, which are located in a first edge portion EP1 including the first side surface S11. In each of the first and second chips 11 and 12, the first pad column C1 may be located between the first side surface S11 and the second pad column C2. For instance, each chip may include a plurality of pad columns, and among the pad columns included in each chip, the first pad column C1 may be an outermost pad column that is closest to the first side surface S11 and the second pad column C2 may be a pad column that is adjacent to the first pad column C1 but farther from the first side surface S11 than the first pad column C1.

In each of the first and second chips 11 and 12, the external signal pads P1 may be included in the first pad column C1, and the slice signal pads P2 may be included in the second pad column C2.

The second chip 12 may be offset with respect to the first chip 11 to expose the first and second pad columns C1 and C2 of the first chip 11.

In a planar view, the first pad column C1 of the first chip 11 may be disposed between the top substrate pads 13A and 13B of the substrate 13 and the second pad column C2 of the first chip 11, and the second pad column C2 of the first chip 11 may be disposed between the first pad column C1 of the first chip 11 and the second chip 12. The first pad column C1 of the first chip 11 may be adjacent to the top substrate pads 13A and 13B of the substrate 13, and the second pad column C2 of the first chip 11 may be adjacent to the second chip 12.

The slice signal pads P2 of the first chip 11 and the slice signal pads P2 of the second chip 12 may be connected to each other through first connection members 21. Each of the slice signal pads P2 of the first chip 11 may be connected to a corresponding slice signal pad P2 of the second chip 12 through the first connection member 21. The first connection members 21 may include bonding wires.

First top substrate pads 13A of the substrate 13 and the external signal pads P1 of the first chip 11 may be connected to each other through second connection members 22. Each of the external signal pads P1 of the first chip 11 may be connected to a corresponding first top substrate pad 13A through the second connection member 22. The second connection members 22 may include bonding wires.

Each of the external signal pads P1 of the first chip 11 may contact a bonding wire that is connected to the substrate 13. Each of the external signal pads P1 of the second chip 12 might not contact a bonding wire. The external signal pads P1 of the second chip 12 may be in a disabled state.

In each of the first and second chips 11 and 12, the power pads P3 may be included in the first pad column C1. The power pads P3 may be disposed in the same pad column as the external signal pads P1. The disposition of the external signal pads P1 and the power pads P3 may be variously changed in the first pad column C1.

Second top substrate pads 13B of the substrate 13 and the power pads P3 of the first chip 11 may be connected to each other through third connection members 23. Each of the power pads P3 of the first chip 11 may be connected to a corresponding second top substrate pad 13B through the third connection member 23. The third connection members 23 may include bonding wires. The first chip 11 may be supplied with power from the substrate 13 through the third connection members 23. The power may include VDD, VSS, VDDQ, and VSSQ.

The power pads P3 of the first chip 11 may contact bonding wires that are connected to the substrate 13. The power pads P3 of the second chip 12 might not be connected to bonding wires. The power pads P3 of the second chip 12 might not contact bonding wires which are connected to the substrate 13. The power pads P3 of the second chip 12 may be in a disabled state.

As the external signal pads P1 and the power pads P3 of the first chip 11 are disposed in the first pad column C1 that is adjacent to the top substrate pads 13A and 13B of the substrate 13 and the slice signal pads P2 of the first chip 11 are disposed in the second pad column C2 that is adjacent to the second chip 12, the first connection members 21 and the second and third connection members 22 and 23 may be disposed on opposing sides, respectively, of the first edge portion EP1 of the first chip 11. That is to say, the first connection members 21 may be disposed on one side of the first edge portion EP1 of the first chip 11, and the second and third connection members 22 and 23 may be disposed on the other side of the first edge portion EP1 of the first chip 11.

Since the second and third connection members 22 and 23 are disposed on only one side of the first edge portion EP1 of the first chip 11, the second and third connection members 22 and 23 might not be disposed on the other side of the first edge portion EP1 of the first chip 11. Accordingly, a large number of first connection members 21 may be disposed on the other side of the first edge portion EP1 of the first chip 11 without being restricted in space due to the second and third connection members 22 and 23. Therefore, even when the number of slice signals is large, it is possible to transmit the slice signals by using the first connection members 21, for example, bonding wires.

FIGS. 5 to 8 are diagrams illustrating data input/output paths of semiconductor packages based on embodiments of the disclosed technology. Hereafter, for the sake of simplicity in explanation, repeated description for the same configuration between different embodiments will be omitted, and only differences will be mainly described.

Figure 5:
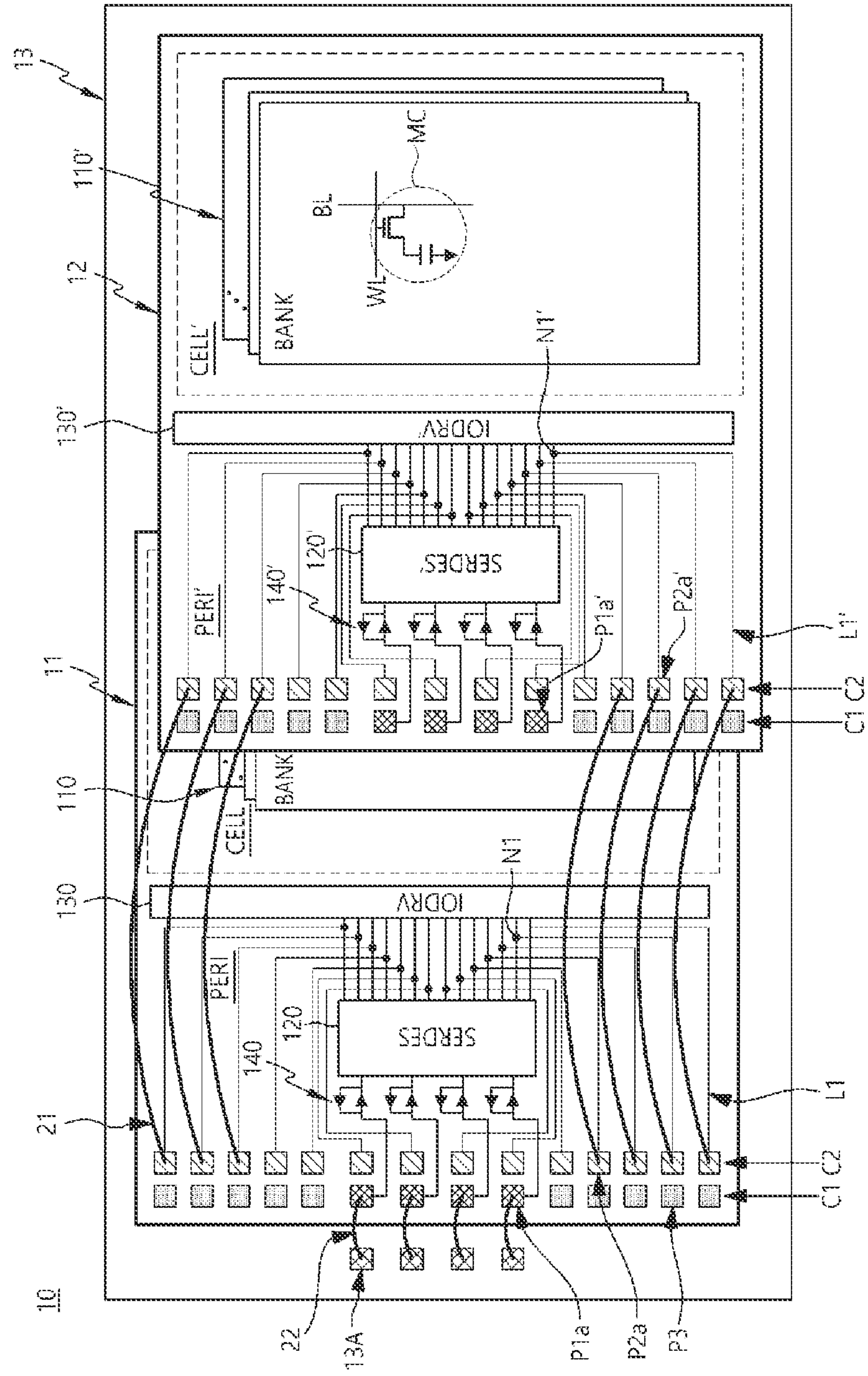
FIGS. 5 to 8 are diagrams illustrating data input/output paths of semiconductor packages based on embodiments of the disclosed technology.

Referring to FIG. 5, a first chip 11 may include a cell region CELL and a peripheral region PERI. A second chip 12 may include a cell region CELL' and a peripheral region PERI'.

A memory cell array 110 may be disposed in the cell region CELL of the first chip 11. A memory cell array 110' may be disposed in the cell region CELL' of the second chip 12. Each of the memory cell arrays 110 and 110' may include a plurality of memory banks BANKs. The number of memory banks included in each of the memory cell arrays 110 and 110' may be, for example, 2, 4, 8, 16, 32, or any number that is a multiple of 2. Each memory bank BANK may include a plurality of word lines WL, a plurality of bit lines BL, and a plurality of memory cells MC. The memory cells MC may be disposed at intersections of the word lines WL and the bit lines BL. For the sake of simplicity in illustration, FIG. 5 illustrates only one word line WL, only one bit line BL and only one memory cell MC.

Although not shown, each of the first and second chips 11 and 12 may include a row decoder that serves to select a word line and a column decoder that serves to select a bit line. The row decoder and the column decoder may be provided for each memory bank BANK. The row decoder and the column decoder of the first chip 11 may be disposed in the cell region CELL, and the row decoder and the column decoder of the second chip 12 may be disposed in the cell region CELL', but the disclosed technology is not limited thereto.

In FIG. 5, the reference symbol P1*a* denotes external data pads of the first chip 11, and the reference symbol P2*a* denotes slice data pads of the first chip 11. The reference symbol Pla' denotes external data pads of the second chip 12, and the reference symbol P2*a*' denotes slice data pads of the second chip 12. Hereafter, for the sake of convenience in explanation, the external data pads P1*a* and P1*a*' will be referred to as first pads, and the slice data pads P2*a* and P2*a*' will be referred to as second pads. The plurality of external data pads Pla may be included in a first pad column C1 of the first chip 11, and the plurality of slice data pads P2*a* may be included in a second pad column C2 of the first chip 11.

The plurality of external data pads Pla' may be included in a first pad column C1 of the second chip 12, and the plurality of slice data pads P2*a*' may be included in a second pad column C2 of the second chip 12. Each of the first and second chips 11 and 12 may further include an external command/address (CA) pad and an external clock pad in the first pad column C1 and may further include a slice command pad and a slice address pad in the second pad column C2. However, illustration of these pads has been omitted for the sake of convenience in explanation.

The peripheral region PERI may be located in a chip edge region of the first chip 11 and may include an edge portion in which the first and second pad columns C1 and C2 are located. The peripheral region PERI' may be located in a chip edge region of the second chip 12 and may include an edge portion in which the first and second pad columns C1 and C2 are located. Each of the first and second chips 11 and 12 may have an edge peripheral structure.

A peripheral circuit of the first chip 11 may be disposed in the peripheral region PERI. The peripheral circuit of the first chip 11 may include a serializer-deserializer (SERDES) 120, an input/output driver (IODRV) 130, and a plurality of input/output buffers 140. A peripheral circuit of the second chip 12 may be disposed in the peripheral region PERI'. The peripheral circuit of the second chip 12 may include a serializer-deserializer (SERDES') 120', an input/output driver (IODRV') 130', and a plurality of input/output buffers 140'.

In the first chip 11, the serializer-deserializer 120 may be connected between the first pads P1*a* and first nodes N1. The serializer-deserializer 120 may be connected to the first pads P1*a* through the input/output buffers 140. In the second chip 12, the serializer-deserializer 120' may be connected between the first pads P1*a*' and first nodes N1'. The serializer-deserializer 120' may be connected to the first pads P1*a*' through the input/output buffers 140'.

The serializer-deserializer 120 of the first chip 11 may receive write data from an external device through the first pads P1*a* of the first chip 11. The serializer-deserializer 120 may parallelize the received write data, and may output the parallelized write data to the first nodes N1 of the first chip 11. For instance, the serializer-deserializer 120 of the first chip 11 may receive four 16-bit data input through four first pads P1*a*, may parallelize the four 16-bit data into 64-bit data, and may output the 64-bit data to the first nodes N1 of the first chip 11. Write data input from the external device to the first pads P1*a* of the first chip 11 may pass through the input/output buffers 140 of the first chip 11, may be parallelized in the serializer-deserializer 120 of the first chip 11, and may be output to the first nodes N1 of the first chip 11.

The serializer-deserializer 120 of the first chip 11 may receive data read from the cell region CELL of the first chip 11 or the cell region CELL' of the second chip 12 and may serialize the data. For instance, the serializer-deserializer 120 of the first chip 11 may receive 64-bit data through 64 first nodes N1 and may serialize the 64-bit data into four 16-bit data. Read data read from the cell region CELL of the first chip 11 or the cell region CELL' of the second chip 12 may be transmitted to the first nodes N1 of the first chip 11. Then, the read data may be serialized in the serializer-deserializer 120 of the first chip 11 and output to the first pads P1*a* of the first chip 11 through the input/output buffers 140 of the first chip 11.

In the first chip 11, the input/output driver 130 may be connected between the first nodes N1 and the cell region CELL. The input/output driver 130 may be connected to the serializer-deserializer 120 through the first nodes N1. The input/output driver 130 may receive write data from the serializer-deserializer 120 through the first nodes N1. The input/output driver 130 may output the received write data to the cell region CELL, and accordingly, data may be stored in the cell region CELL. The input/output driver 130 may receive read data from the cell region CELL, and may output the received read data to the first nodes N1. In the second chip 12, the input/output driver 130' may be connected between the first nodes N1' and the cell region CELL'. The input/output driver 130' may be connected to the serializer-deserializer 120' through the first nodes N1'. The input/output driver 130' may receive write data from the first chip 11 through the first connection member 21, the second pads P2*a*', internal wirings L1' and the first nodes N1'. The input/output driver 130' may output the received write data to the cell region CELL', and accordingly, data may be stored in the cell region CELL'. The input/output driver 130' may receive read data from the cell region CELL', and may output the received read data to the first nodes N1'.

In the first chip 11, the first nodes N1 may be connected to the second pads P2*a* through internal wirings L1. Each of the first nodes N1 may be connected to a corresponding second pad P2*a* through the internal wiring L1. The first nodes N1 may correspond, one-to-one, to the second pads P2*a*. In the second chip 12, the first nodes N1' may be connected to the second pads P2*a*' through the internal wirings L1'. Each of the first nodes N1' may be connected to a corresponding second pad P2*a*' through the internal wiring L1'. The first nodes N1' may correspond, one-to-one, to the second pads P2*a'*.

The second pads P2*a* of the first chip 11 and the second pads P2*a*' of the second chip 12 may be connected through first connection members 21. Each of the second pads P2*a* of the first chip 11 may be connected to a corresponding second pad P2*a*' of the second chip 12 through the first connection member 21. For the sake of simplicity in illustration, in FIG. 5, illustration of first connection members 21 adjacent to the serializer-deserializer 120, among the first connection members 21, has been omitted.

The input/output driver 130 of the first chip 11 may interface with the serializer-deserializer 120 of the first chip 11 through the first nodes N1 of the first chip 11, and thereby, may exchange data with the serializer-deserializer 120 of the first chip 11.

The input/output driver 130' of the second chip 12 may interface with the serializer-deserializer 120 of the first chip 11 through the first nodes N1' of the second chip 12, the internal wirings L1' of the second chip 12, the second pads P2*a*' of the second chip 12, the first connection members 21, the second pads P2*a* of the first chip 11, the internal wirings L1 of the first chip 11 and the first nodes N1 of the first chip 11, and thereby, may exchange data with the serializer-deserializer 120 of the first chip 11.

The input/output driver 130 of the first chip 11 and the input/output driver 130' of the second chip 12 may interface in common with the serializer-deserializer 120 of the first chip 11 and may share the serializer-deserializer 120 of the first chip 11.

The serializer-deserializer 120' of the second chip 12 might not be used. In addition, the input/output buffers 140' and the first pads P1*a*' of the second chip 12 might not be used. The serializer-deserializer 120', the input/output buffers 140' and the first pads P1*a*' of the second chip 12 may be dummy structures which do not function electrically. In other words, the first pads P1*a*' of the second chip 12 may be dummy pads, the input/output buffers 140' of the second chip 12 may be dummy input/output buffers, and the serializer-deserializer 120' of the second chip 12 may be a dummy serializer-deserializer.

When a device including the semiconductor package 10 is booted, the first chip 11 may perform an initial setting operation in response to a command input from the external device. In the initial setting operation, the first chip 11 may generate a disable signal for disabling the serializer-deserializer 120' and the input/output buffers 140' of the second chip 12 and may provide the disable signal to the second chip 12. The serializer-deserializer 120' and the input/output buffers 140' of the second chip 12 may be disabled in response to the disable signal received from the first chip 11. After the initial setting operation, the serializer-deserializer 120' and the input/output buffers 140' of the second chip 12 may be maintained in a disabled state regardless of the operations of the semiconductor package 10 and the device including the same.

Since the serializer-deserializer 120' and the input/output buffers 140' of the second chip 12 are maintained in a disabled state, the power consumption of the second chip 12 may be less than that of the first chip 11. Accordingly, power consumption may be reduced compared to a case in which the first chip 11 and the second chip 12 are driven in the same manner.

The first pads P1*a* of the first chip 11 may be connected to first top substrate pads 13A of a substrate 13 through second connection members 22. The second connection members 22 may include bonding wires. Each of the first pads P1*a*' of the second chip 12 may be in floating state. Each of the first pads P1*a*' of the second chip 12 might not contact a bonding wire which is connected to the substrate 13.

Figure 6:
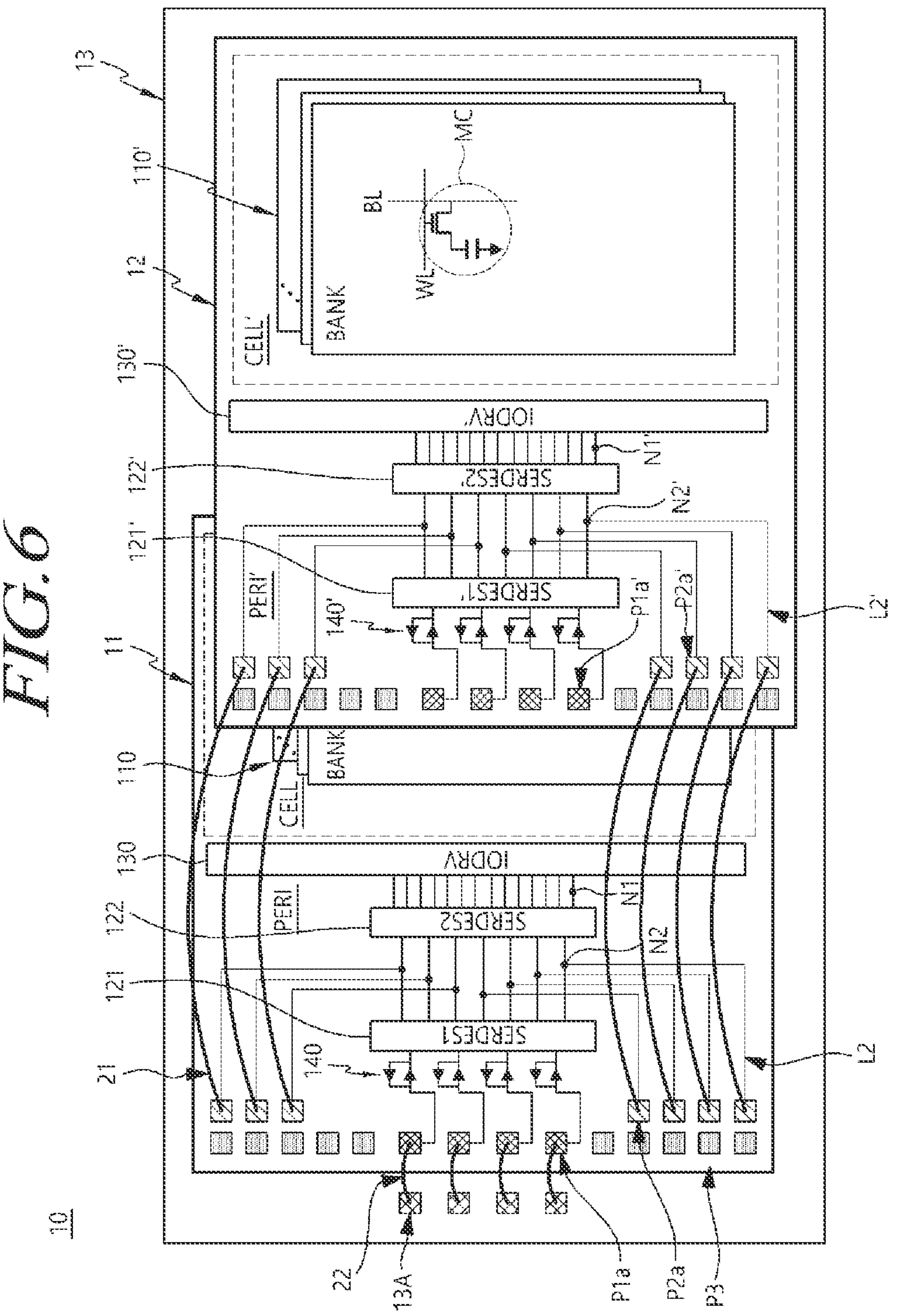

Referring to FIG. 6, a serializer-deserializer of the first chip 11 may be divided into two levels. Also, a serializer-deserializer of the second chip 12 may be divided into two levels. The serializer-deserializer of the first chip 11 may include a first level serializer-deserializer (SERDES1) 121 and a second level serializer-deserializer (SERDES2) 122. The serializer-deserializer of the second chip 12 may include a first level serializer-deserializer (SERDES1') 121' and a second level serializer-deserializer (SERDES2') 122'.

In the first chip 11, the first level serializer-deserializer 121 may be connected between first pads P1*a* and second nodes N2. The first level serializer-deserializer 121 may be connected to the first pads P1*a* through input/output buffers 140. In the second chip 12, the first level serializer-deserializer 121' may be connected between first pads P1*a*' and second nodes N2'. The first level serializer-deserializer 121' may be connected to the first pads P1*a*' through input/output buffers 140'.

The first level serializer-deserializer 121 may receive write data from an external device through the first pads P1*a* of the first chip 11. The first level serializer-deserializer 121 may parallelize the received write data, and may output the parallelized write data to the second nodes N2 of the first chip 11.

The first level serializer-deserializer 121 may parallelize write data input through the first pads P1*a*, thereby expanding the window of write data to a 2F (F is a natural number) multiple.

The first level serializer-deserializer 121 may receive read data from a cell region CELL of the first chip 11 or a cell region CELL' of the second chip 12, and may serialize the received read data. The read data may be transmitted to the second nodes N2. The read data may be serialized in the first level serializer-deserializer 121 and output to the first pads P1*a* through the input/output buffers 140 of the first chip 11.

In the first chip 11, the second level serializer-deserializer 122 may be connected between the second nodes N2 and first nodes N1. The second level serializer-deserializer 122 may receive write data input from the first level serializer-deserializer 121 through the second nodes N2. The second level serializer-deserializer 122 may parallelize the received write data, and may output the parallelized write data to the first nodes N1. The second level serializer-deserializer 122 may expand the window of the received write data to 2K (K is a natural number) multiple. For instance, K may be 1. In the second chip 12, the second level serializer-deserializer 122' may be connected between the second nodes N2' and first nodes N1'. The second level serializer-deserializer 122' may receive write data from the first chip 11 through the first connection members 21, the internal wirings L2', and the second nodes N2'. The second level serializer-deserializer 122' may parallelize the received write data and may output the parallelized write data to the first nodes N1'. The second level serializer-deserializer 122' may expand the window of the received write data to 2K (K is a natural number) multiple. For instance, K may be 1.

In the first chip 11, the second level serializer-deserializer 122 may receive read data from the cell region CELL through first nodes N1. The second level serializer-deserializer 122 may serialize the received read data, and output the serialized read data to the second nodes N2. The number of second nodes N2 may be 1/2K (K is a natural number) times the number of first nodes N1. For instance, K may be 1. When the number of first nodes N1 is 64, the number of second nodes N2 may be 32, which is half the number of first nodes N1. In the second chip 12, the second level serializer-deserializer 122' may receive read data from the cell region CELL' through the first nodes N1'. The second level serializer-deserializer 122' may serialize the received read data, and output the serialized read data to the second nodes N2'. The number of second nodes N2' may be 1/2K (K is a natural number) times the number of first nodes N1'. For instance, K may be 1. When the number of first nodes N1' is 64, the number of second nodes N2' may be 32, which is half the number of first nodes N1'.

In the first chip 11, the second nodes N2 may be connected to second pads P2*a* through internal wirings L2. The second nodes N2 and the second pads P2*a* may be connected to each other through the internal wirings L2. The number of second pads P2*a* may be the same as the number of second nodes N2. The second pads P2*a* may correspond, one-to-one, to the second nodes N2. In the second chip 12, the second nodes N2' may be connected to second pads P2*a*' through internal wirings L2'. The second nodes N2' and the second pads P2*a*' may be connected to each other through the internal wirings L2'. The number of second pads P2*a*' may be the same as the number of second nodes N2'. The second pads P2*a*' may correspond, one-to-one, to the second nodes N2'.

The second pads P2*a* of the first chip 11 and the second pads P2*a*' of the second chip 12 may be connected to each other through first connection members 21.

The second level serializer-deserializer 122 of the first chip 11 may interface with the first level serializer-deserializer 121 of the first chip 11 through the second nodes N2 of the first chip 11 to exchange data with the first level serializer-deserializer 121 of the first chip 11.

The second level serializer-deserializer 122' of the second chip 12 may interface with the first level serializer-deserializer 121 of the first chip 11 through the second nodes N2' of the second chip 12, the internal wirings L2' of the second chip 12, the second pads P2*a*' of the second chip 12, the first connection members 21, the second pads P2*a* of the first chip 11, the internal wirings L2 of the first chip 11 and the second nodes N2 of the first chip 11 to exchange data with the first level serializer-deserializer 121 of the first chip 11.

The second level serializer-deserializer 122 of the first chip 11 and the second level serializer-deserializer 122' of the second chip 12 may interface in common with the first level serializer-deserializer 121 of the first chip 11 and may share the first level serializer-deserializer 121 of the first chip 11.

The first level serializer-deserializer 121' of the second chip 12 might not be used. In addition, the input/output buffers 140' of the second chip 12 and the first pads P1*a*' of the second chip 12 might not be used. The first level serializer-deserializer 121', the input/output buffers 140' and the first pads P1*a*' of the second chip 12 may be non-functional dummy structures. Namely, the first pads P1*a*' of the second chip 12 may be dummy pads, the input/output buffers 140' of the second chip 12 may be dummy input/output buffers, and the first level serializer-deserializer 121' of the second chip 12 may be a dummy first level serializer-deserializer.

When a device including the semiconductor package 10 is booted, the first chip 11 may perform an initial setting operation in response to an external command input from the external device. In the initial setting operation, the first chip 11 may generate a disable signal for disabling the first level serializer-deserializer 121' and the input/output buffers 140' of the second chip 12 and may provide the disable signal to the second chip 12. The first level serializer-deserializer 121' and the input/output buffers 140' of the second chip 12 may be disabled in response to the disable signal from the first chip 11. After the initial setting operation, the first level serializer-deserializer 121' and the input/output buffers 140' of the second chip 12 may be maintained in a disabled state regardless of the operations of the semiconductor package 10 and the device including the same.

Since the first level serializer-deserializer 121' and the input/output buffers 140' of the second chip 12 are maintained in a disabled state, the power consumption of the second chip 12 may be less than that of the first chip 11. Accordingly, power consumption may be reduced compared to the case of driving the first chip 11 and the second chip 12 in the same manner.

According to the present embodiment, since the serializer-deserializer of the first chip 11 is divided into the first level serializer-deserializer 121 and the second level serializer-deserializer 122 and the second pads P2*a* are connected to the second nodes N2 between the first level serializer-deserializer 121 and the second level serializer-deserializer 122, the number of second pads P2*a* may be reduced when compared to a case in which the second pads P2*a* are connected to the first nodes N1. Since the serializer-deserializer of the second chip 12 is divided into the first level serializer-deserializer 121' and the second level serializer-deserializer 122' and the second pads P2*a*' are connected to the second nodes N2' between the first level serializer-deserializer 121' and the second level serializer-deserializer 122', the number of second pads P2*a*' may be reduced when compared to a case in which the second pads P2*a*' are connected to the first nodes N1'. Accordingly, the number of first connection members 21 connecting the second pads P2*a* of the first chip 11 and the second pads P2*a*' of the second chip 12 may be reduced, and the space required to dispose the first connection members 21 may be reduced.

Although a case in which the first chip 11 and the second chip 12 are the same type of chips has been described above, the first chip 11 and the second chip 12 may be different types of chips. In this case, as will be described below with reference to FIGS. 7 and 8, the configuration disabled in the second chip 12 in the previous embodiment may be omitted.

Figure 7:
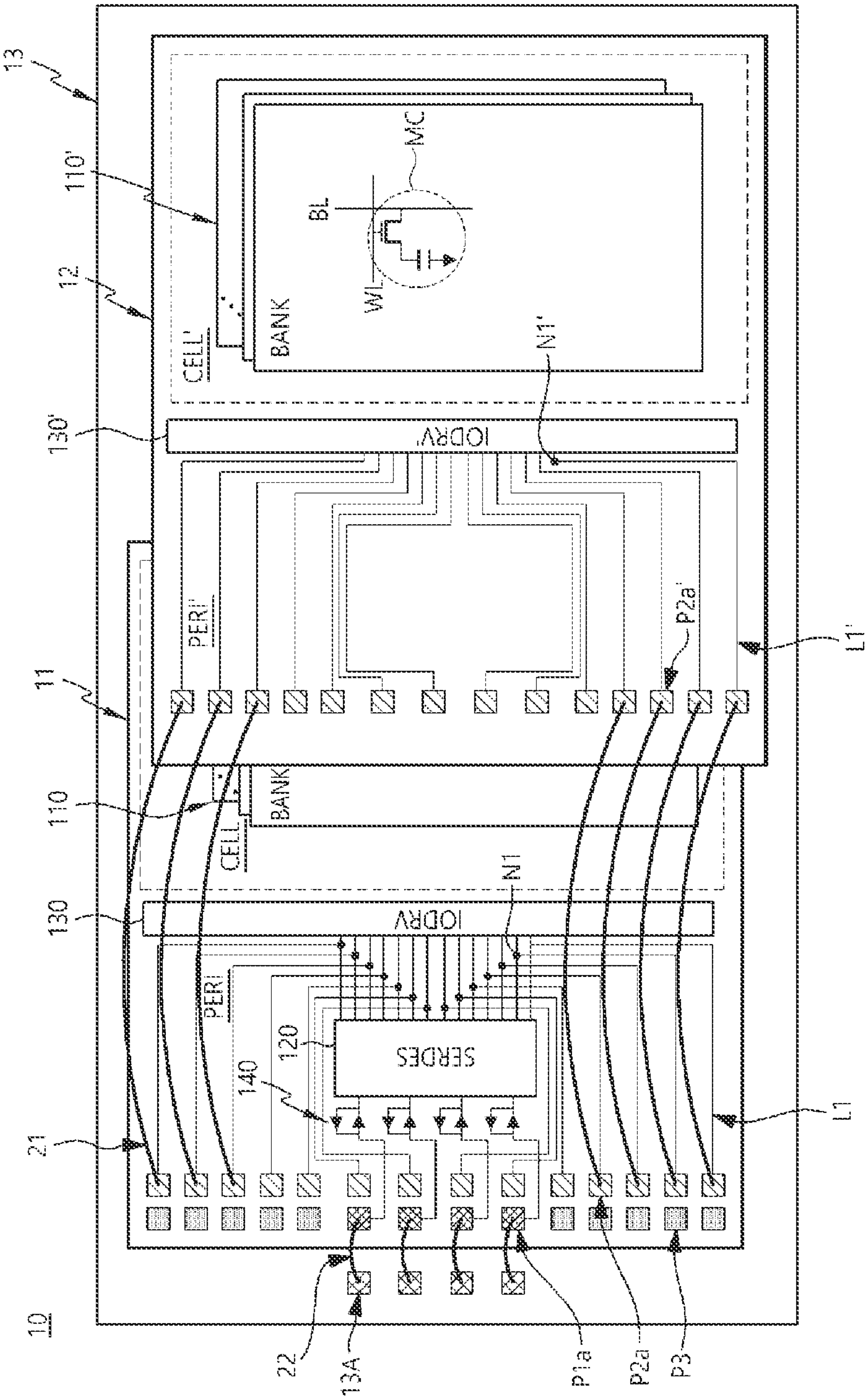

Referring to FIG. 7, compared to the second chip 12 of FIG. 5, a second chip 12 might not include a serializer-deserializer 120' of FIG. 5, input/output buffers 140' of FIG. 5 and first pads P1*a*' of FIG. 5. The second chip 12 might also not include other external signal pads.

Although FIG. 7 illustrates a case in which the second chip 12 does not include all of the serializer-deserializer 120', the input/output buffers 140' and the first pads P1*a*', the second chip 12 might not include at least one of the serializer-deserializer 120', the input/output buffers 140', and the first pads P1*a*'. Although not shown, the second chip 12 mighty also not include other external signal pads, for example, an external command/address (CA) pad and an external clock pad.

As at least one of the serializer-deserializer 120', the input/output buffers 140', the external signal pads and power pads P3' has been omitted, space for an omitted component could be saved. Thus, the second chip 12 may be smaller in size than the first chip 11.

Figure 8:
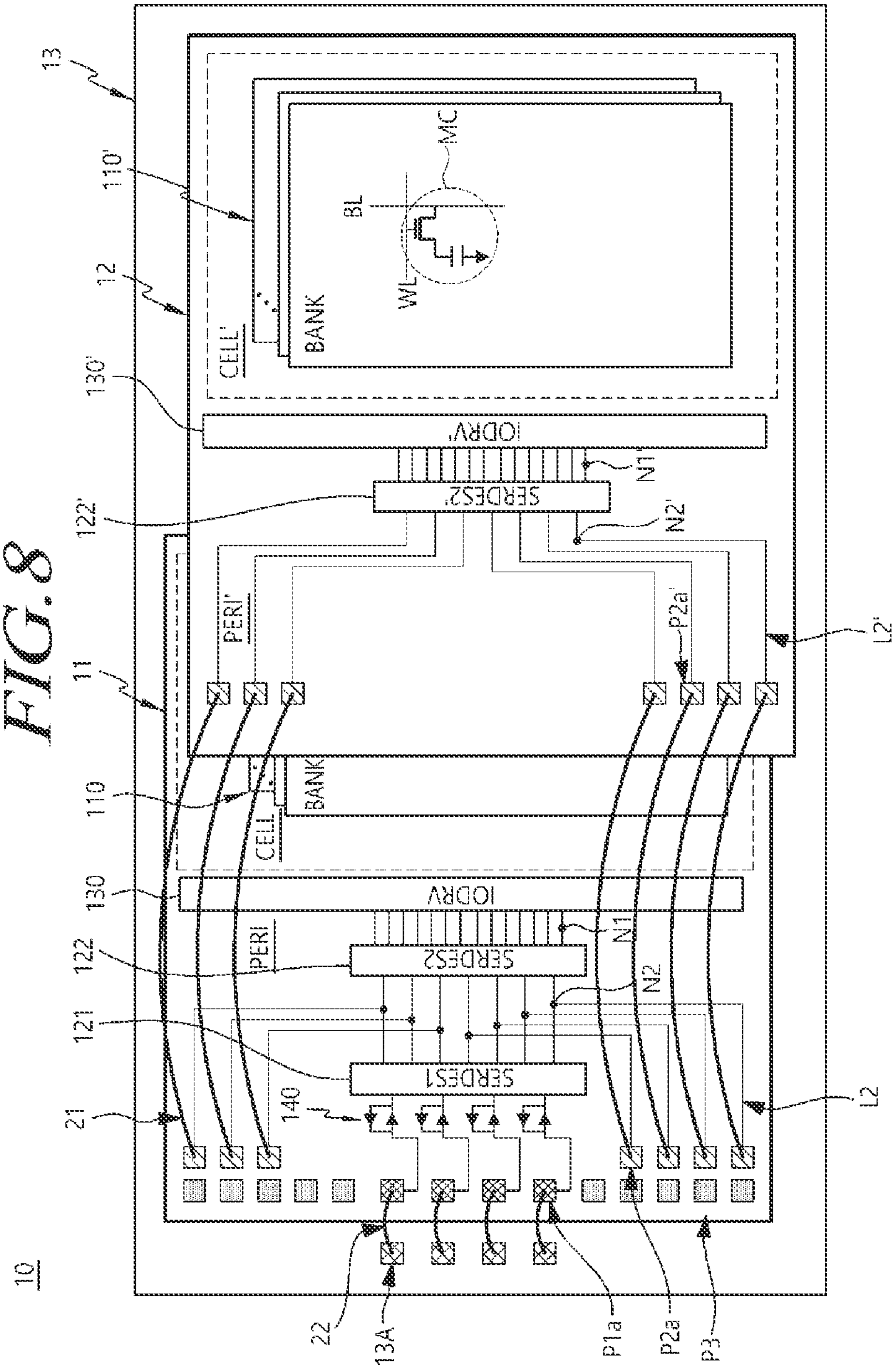

Referring to FIG. 8, compared to the second chip 12 of FIG. 6, a second chip 12 might not include a first level serializer-deserializer 121' of FIG. 6, input/output buffers 140' of FIG. 6, and first pads P1*a*' of FIG. 6.

Although FIG. 8 illustrates a case in which the second chip 12 does not include all of the first level serializer-deserializer 121', the input/output buffers 140', and the first pads P1*a*', the second chip 12 might not include at least one of the first level serializer-deserializer 121', the input/output buffers 140', and the first pads P1*a*'. Although not shown, the second chip 12 might also not include other external signal pads.

As at least one of the first level serializer-deserializer 121', the input/output buffers 140', the external signal pads, and power pads P3' has been omitted, space for an omitted component could be saved. Thus, the second chip 12 may be smaller in size than the first chip 11.

Figure 9:
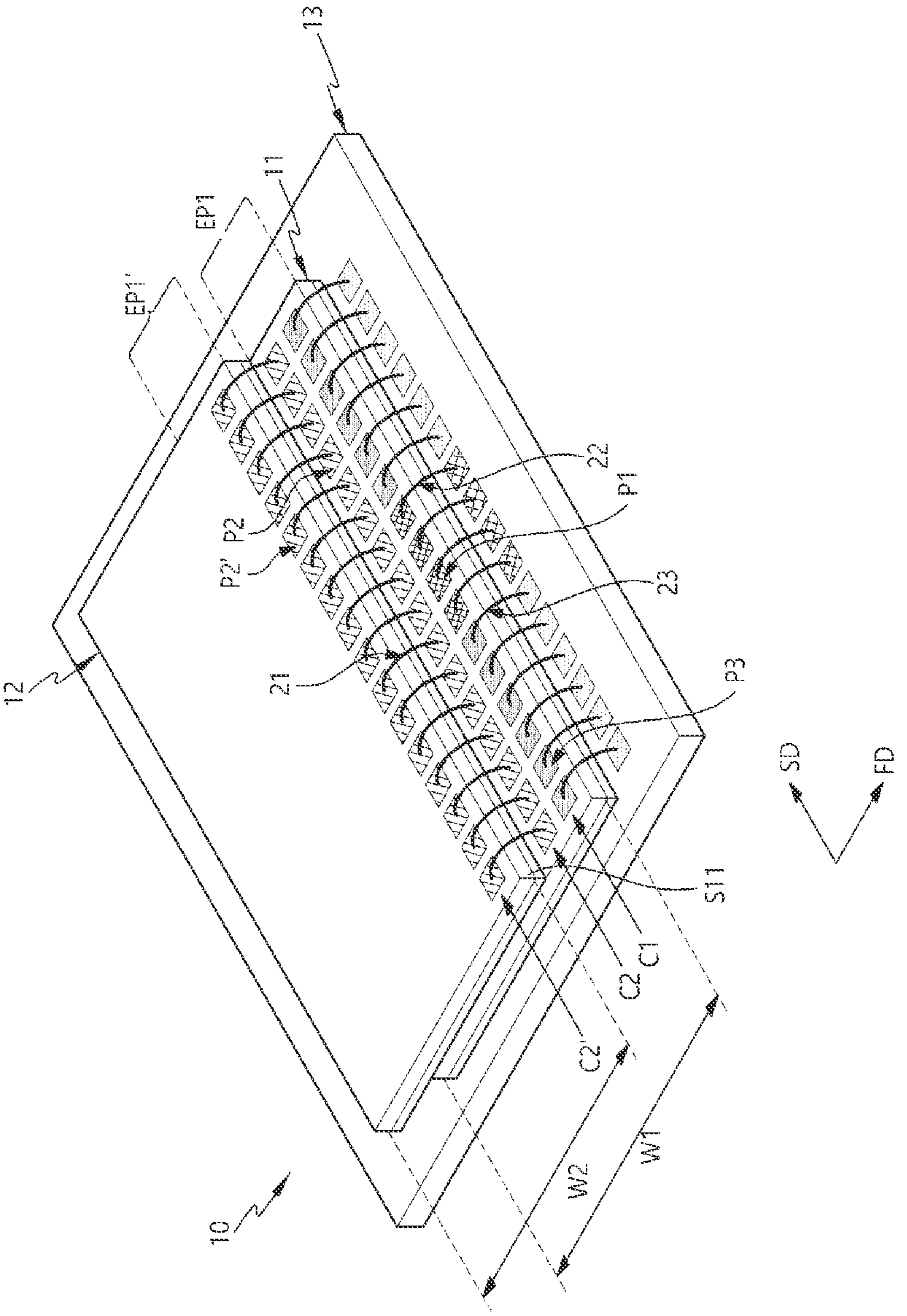
FIGS. 9, 10, 12 and 14 are perspective views of semiconductor packages based on embodiments of the disclosed technology.

FIG. 9 is a perspective view of a semiconductor package based on an embodiment of the disclosed technology, illustrating a case where a first chip 11 and a second chip 12 are different types of chips.

Referring to FIG. 9, compared to the first chip 11, the second chip 12 might not include external signal pads P1.

As the second chip 12 does not include external signal pads P1, the second chip 12 might not have a pad column for disposing external signal pads P1. The second chip 12 may have less pad columns than the first chip 11.

Since the second chip 12 includes less pad columns than the first chip 11, the second chip 12 may have a smaller width than the first chip 11. For instance, when the width of the first chip 11 is W1, the width of the second chip 12 may be W2, which is smaller than W1.

As the second chip 12 does not have a pad column for disposing external signal pads P1, a pad column C2' in which slice signal pads P2' are disposed in the second chip 12 may be disposed close to a first side surface S11 of the second chip 12, which is adjacent to a first edge portion EP1 of the first chip 11.

The slice signal pads P2 of the first chip 11 and the slice signal pads P2' of the second chip 12, which are connected to each other through first connection members 21, may be adjacent to each other with the first side surface S11 of the second chip 12 interposed therebetween. The first connection members 21 may have a short length that connects the slice signal pads P2 of the first chip 11 to the slice signal pads P2' of the second chip 12, which are adjacent to each other.

Although the embodiments of FIGS. 2 to 9 illustrate a case in which the power pads P3 are disposed in the first edge portion EP1 or EP1' together with the external signal pads P1 and the slice signal pads P2 or P2', the power pads P3 may be disposed in another edge portion of a chip other than the first edge portion EP1 or EP1', as will be described below with reference to FIGS. 10 to 13.

Figure 10:
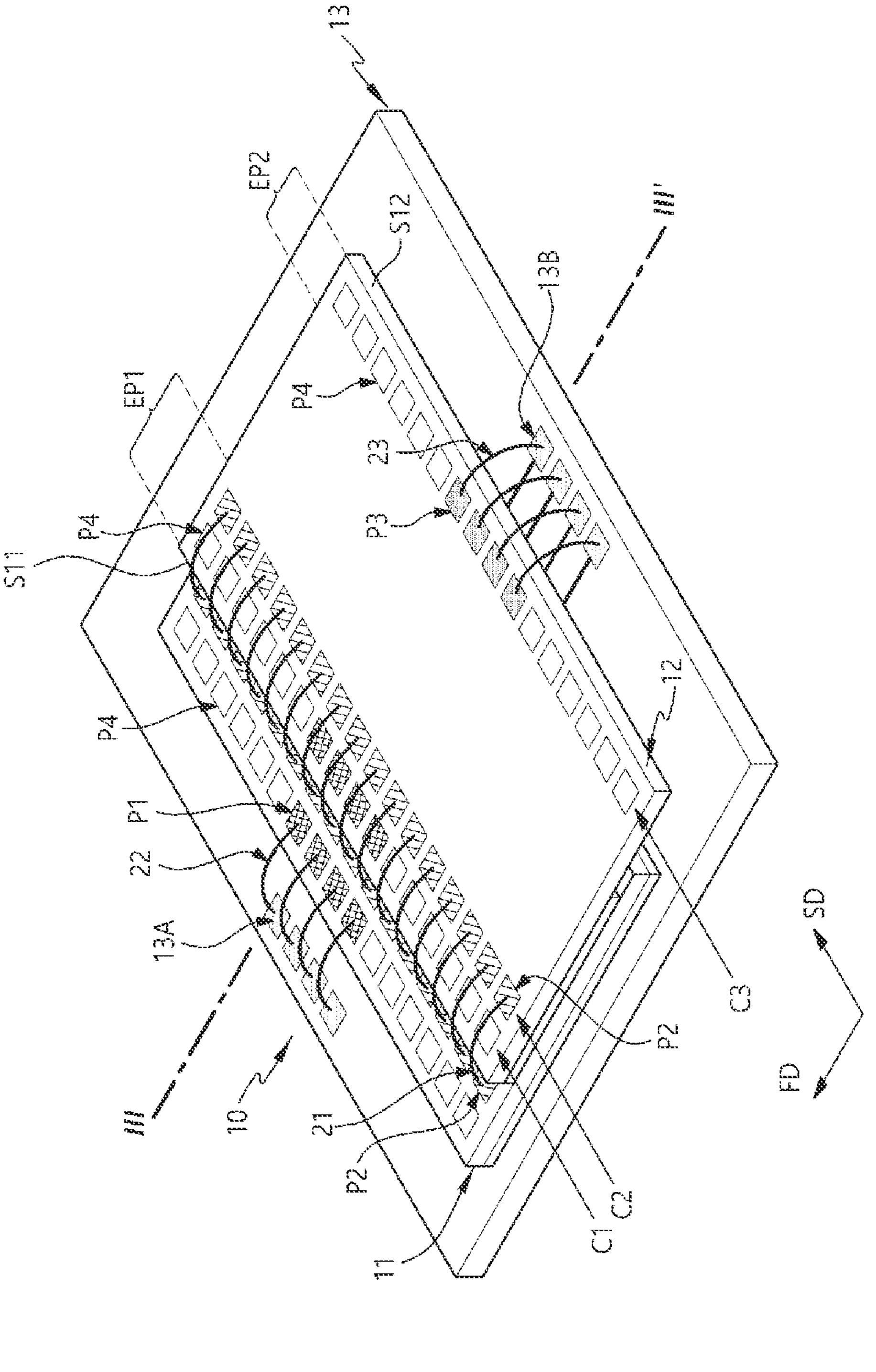
Figure 11:
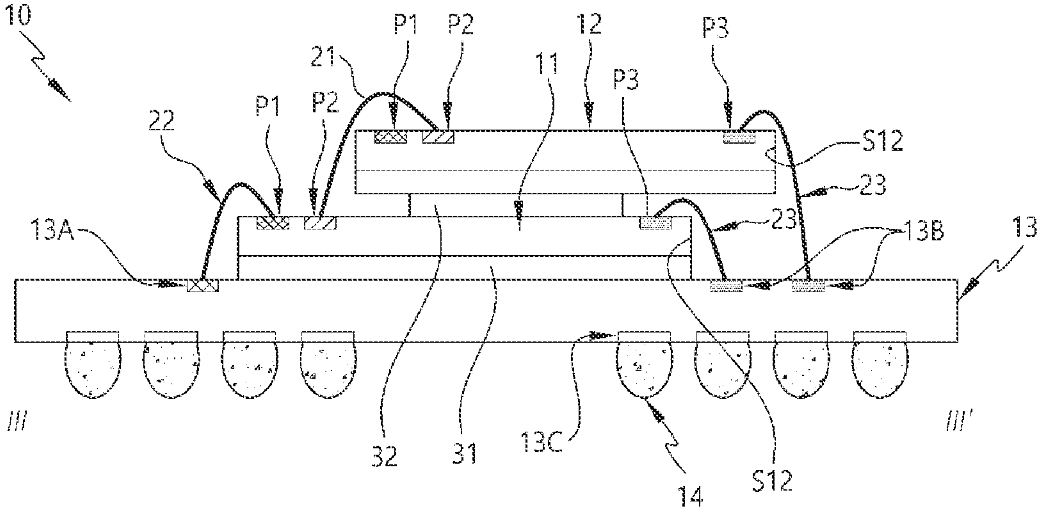
FIG. 11 is a cross-sectional view taken along the line III-III' of FIG. 10.

FIG. 10 is a perspective view of a semiconductor package based on an embodiment of the disclosed technology, and FIG. 11 is a cross-sectional view taken along the line III-III' of FIG. 10.

Referring to FIGS. 10 and 11, each of first and second chips 11 and 12 may include a third pad column C3 that is located in a second edge portion EP2 on the opposite side of the corresponding chip compared to a first edge portion EP1. For example, the third pad column C3 may be an outermost pad column that is closest to a second side surface S12 included in the second edge portion EP2, among a plurality of pad columns included in each chip. In each of the first and second chips 11 and 12, power pads P3 may be included in the third pad column C3. Pads P4 for another purpose not described may be additionally disposed in at least one of first and third pad columns C1 and C3. For the sake of simplicity in illustration, FIG. 10 illustrates that connection members are not connected to the pads P4, but, if necessary, connection members may be connected to the pads P4.

The power pads P3 of the first chip 11 and the power pads P3 of the second chip 12 may be connected to second top substrate pads 13B of a substrate 13 through third connection members 23. When viewed from the top, the second top substrate pads 13B that are connected to the power pads P3 of the first chip 11 through the third connection members 23 may be adjacent to the second edge portion EP2 of the first chip 11. When viewed from the top, the second top substrate pads 13B that are connected to the power pads P3 of the second chip 12 through the third connection members 23 may be adjacent to the second edge portion EP2 of the second chip 12. The third connection members 23 may be disposed on the side of the second edge portions EP2 of the first and second chips 11 and 12.

By disposing the power pads P3 in the second edge portion EP2, an area allocated to dispose slice signal pads P2 in the first edge portion EP1 may be increased. For example, the number of slice signal pads P2 disposed in the first edge portion EP1 may be increased. Also, power supply capability may be improved by increasing the size of the slice signal pads P2.

FIGS. 10 and 11 illustrate a case in which the first chip 11 and the second chip 12 are the same type of chips and the second chip 12 includes external signal pads P1 which are not used, but the disclosed technology is not limited thereto. Although not shown, the first chip 11 and the second chip 12 may be different types of chips, and the second chip 12 might not include external signal pads P1 compared to the first chip 11.

Figure 12:
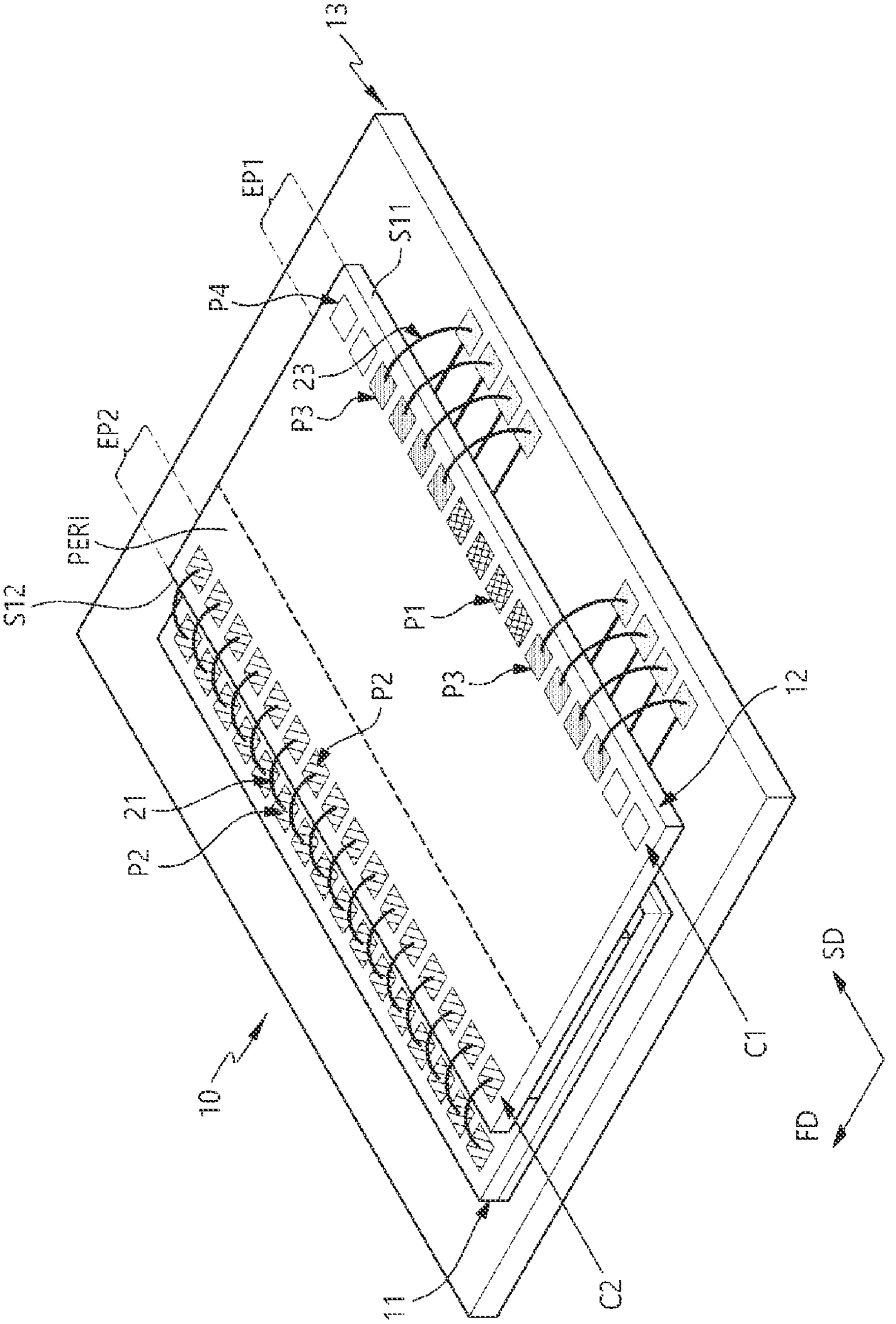
Figure 13:
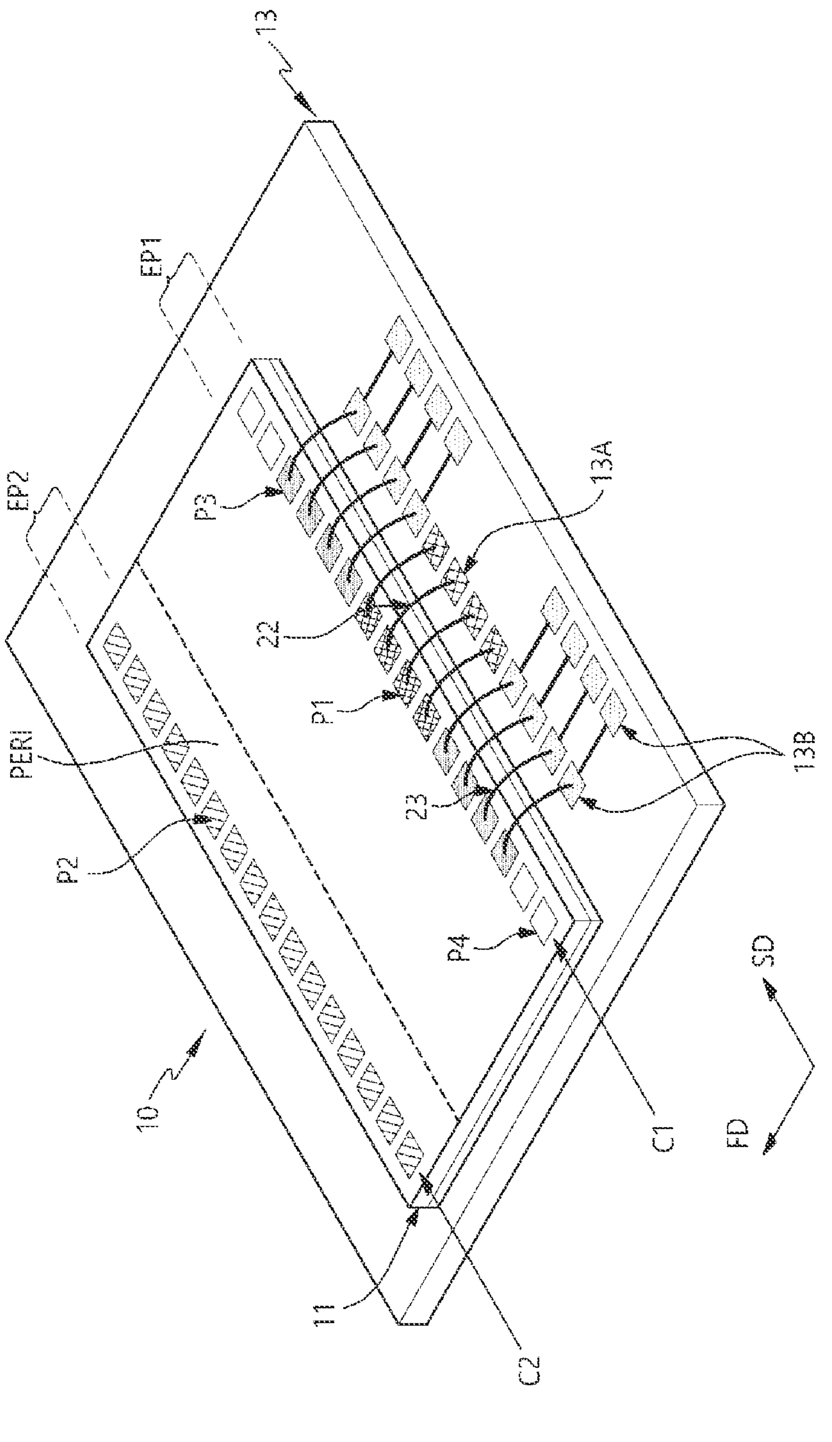
FIG. 13 is a perspective view illustrating a substrate, a first chip and connection members connecting the substrate and the first chip in FIG. 12.

FIG. 12 is a perspective view of a semiconductor package based on an embodiment of the disclosed technology, and FIG. 13 is a perspective view illustrating a substrate, a first chip, and connection members connecting the substrate to the first chip in FIG. 12.

Referring to FIGS. 12 and 13, in each of first and second chips 11 and 12, a first pad column C1 may be located in a first edge portion EP1, and a second pad column C2 may be located in a second edge portion EP2. Among a plurality of pad columns included in each chip, the first pad column C1 may be an outermost pad column that is closest to a first side surface S11 of each chip, and the second pad column C2 may be an outermost pad column that is closest to a second side surface S12 of each chip.

In each of the first and second chips 11 and 12, external signal pads P1 and power pads P3 may be included in the first pad column C1, and slice signal pads P2 may be included in the second pad column C2.

The second chip 12 may be offset with respect to the first chip 11 to expose the second pad column C2 including the slice signal pads P2 of the first chip 11. Since the second pad column C2 of the first chip 11 is an outermost pad column, the second chip 12 may be offset with respect to the first chip 11 by only a width corresponding to one pad column.

Each of the first and second chips 11 and 12 may have a peripheral region PERI including the second edge portion EP2. Although not shown, a peripheral circuit (not shown) that is connected to the slice signal pads P2 may be disposed in the peripheral region PERI. For example, the peripheral circuit may include the serializer-deserializer 120, the input/output driver 130 and the input/output buffers 140 of FIG. 5. For another example, the peripheral circuit may include the first and second level serializer-deserializers 121 and 122, the input/output driver 130 and the input/output buffers 140 of FIG. 6. The slice signal pads P2 and the peripheral circuit may be disposed close to each other in the peripheral region PERI.

By disposing the external signal pads P1 and the power pads P3 in the first edge portion EP1, the second edge portion EP2 may be fully allocated for the disposition of the slice signal pads P2. Accordingly, since the number of slice signal pads P2 disposed in the second edge portion EP2 may be increased, even when the number of slice signals is large, the slice signals may be transmitted using first connection members 21.

Figure 14:
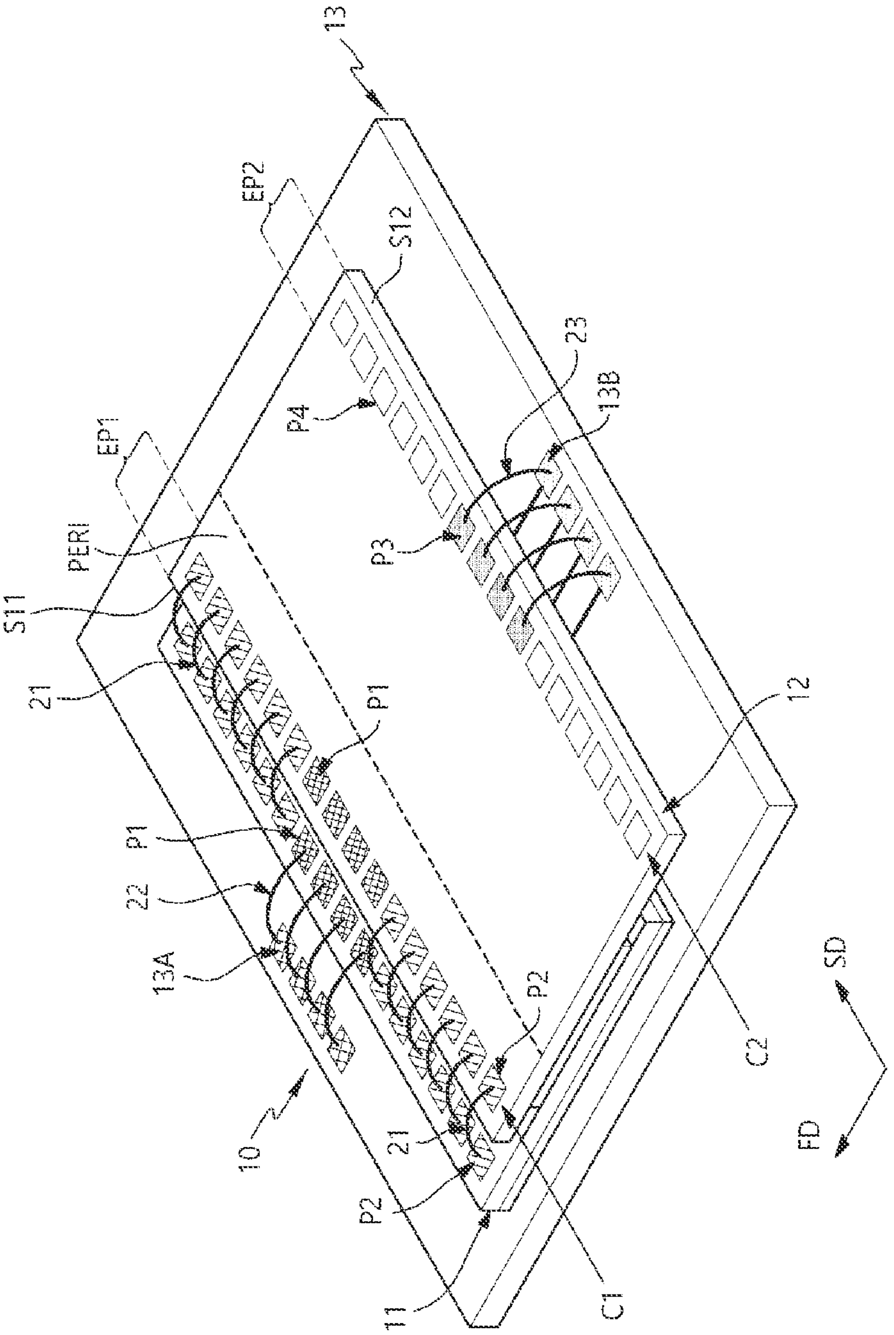

FIG. 14 is a perspective view of a semiconductor package based on an embodiment of the disclosed technology.

Referring to FIG. 14, each of first and second chips 11 and 12 may include a first pad column C1 that is located in a first edge portion EP1 and a second pad column C2 that is located in a second edge portion EP2.

In each of the first and second chips 11 and 12, external signal pads P1 and slice signal pads P2 may be included in the first pad column C1.

Each of the first and second chips 11 and 12 may have a peripheral region PERI including the first edge portion EP1. A peripheral circuit (not shown) that is connected to the external signal pads P1 and the slice signal pads P2 may be disposed in the peripheral region PERI. For example, the peripheral circuit may include the serializer-deserializer 120, the input/output driver 130 and the input/output buffers 140 of FIG. 5. For another example, the peripheral circuit may include the first and second level serializer-deserializers 121 and 122, the input/output driver 130 and the input/output buffers 140 of FIG. 6.

The slice signal pads P2 of the first chip 11 and the slice signal pads P2 of the second chip 12 may be connected to each other through first connection members 21. The first connection members 21 may be disposed on the side of the first edge portions EP1 of the first and second chips 11 and 12.

The external signal pads P1 of the first chip 11 and first top substrate pads 13A of a substrate 13 may be connected through second connection members 22. The second connection members 22 may be disposed on the side of the first edge portion EP1 of the first chip 11.

Power pads P3 of the first and second chips 11 and 12 may be connected to second top substrate pads 13B of the substrate 13 through third connection members 23. The third connection members 23 may be disposed on the side of the second edge portions EP2 of the first and second chips 11 and 12.

FIGS. 12 and 14 illustrate a case in which the first chip 11 and the second chip 12 are the same type of chips and the second chip 12 includes external signal pads P1 that are not used, but the disclosed technology is not limited thereto. Although not shown, the first chip 11 and the second chip 12 may be different types of chips, and the second chip 12 might not include external signal pads P1 compared to the first chip 11.

In the detailed description, functionally similar components among the components of the first chip and the components of the second chip are indicated by the same reference numerals, but this is only for simplicity. Components indicated with the same reference numerals should not be interpreted as being completely identical.

Although exemplary embodiments of the present disclosure have been described for illustrative purposes, those skilled in the art will appreciate that various modifications, additions and substitutions are possible, without departing from the scope and spirit of the present disclosure. Therefore, the embodiments disclosed above and in the accompanying drawings should be considered in a descriptive sense only and not for limiting the technological scope. The technological scope of the present disclosure is not limited by the embodiments and the accompanying drawings.

What is claimed is:

1. A semiconductor package comprising:

a substrate;

a first chip and a second chip stacked on the substrate, each including a first pad, a cell region, a first level serializer-deserializer connected to the first pad, a second level serializer-deserializer connected between the first level serializer-deserializer and the cell region, and a second pad that is connected to a node between the first level serializer-deserializer and the second level serializer-deserializer; and a first connection member connecting the second pad of the first chip to the second pad of the second chip.

2. The semiconductor package according to claim 1, wherein the first connection member includes a bonding wire.

3. The semiconductor package according to claim 1, wherein the second level serializer-deserializer of the first chip and the second level serializer-deserializer of the second chip interface in common with the first level serializer-deserializer of the first chip.

4. The semiconductor package according to claim 1, wherein each of the first chip and the second chip further includes an input/output buffer that is connected between the first pad and the first level serializer-deserializer.

5. The semiconductor package according to claim 1, wherein the first pad of the first chip contacts a bonding wire that is connected to the substrate, and wherein the first pad of the second chip does not contact a bonding wire that is connected to the substrate.

6. The semiconductor package according to claim 1, wherein the node includes a plurality of nodes, wherein the second pad includes a plurality of second pads, wherein, in each of the first and second chips, the number of nodes corresponds, one-to-one, to the number of second pads.

7. The semiconductor package according to claim 1, wherein each of the first and second chips includes first and second pad columns that are located in a first edge portion, wherein the first pad column is located between a chip side surface included in the first edge portion and the second pad column, and wherein, in each of the first and second chips, the first pad is included in the first pad column, and the second pad is included in the second pad column.

8. The semiconductor package according to claim 7, wherein each of the first and second chips includes a plurality of pad columns, and wherein the first pad column is a pad column that is closest to the chip side surface included in the first edge portion, among the plurality of pad columns, and wherein the second pad column is a pad column that is close to the chip side surface included in the first edge portion, adjacent to the first pad column.

9. The semiconductor package according to claim 7, wherein the second chip is stacked on the first chip, and wherein the second chip is offset with respect to the first chip to expose the first and second pad columns of the first chip.

10. The semiconductor package according to claim 7, wherein, in each of the first and second chips, the first and second level serializer-deserializers are disposed in a peripheral region including the first edge portion.

11. The semiconductor package according to claim 7, wherein each of the first chip and the second chip further includes a power pad that is included in the first pad column, wherein the power pad of the first chip contacts a bonding wire that is connected to the substrate, and wherein the power pad of the second chip does not contact a bonding wire that is connected to the substrate.

12. The semiconductor package according to claim 7, wherein each of the first and second chips further includes a power pad that is located in a second edge portion, wherein the first edge portion and the second edge portion are on opposing sides of a corresponding chip, and wherein the power pad of the first chip and the power pad of the second chip are connected to the substrate through bonding wires, respectively.

13. The semiconductor package according to claim 1, wherein each of the first and second chips includes a first pad column that is located in a first edge portion and a second pad column that is located in a second edge portion, wherein the first edge portion and the second edge portion are on opposing sides of a corresponding chip, and wherein, in each of the first and second chips, the first pad is included in the first pad column, and the second pad is included in the second pad column.

14. The semiconductor package according to claim 13, wherein the second chip is stacked on the first chip, and wherein the second chip is offset with respect to the first chip to expose the second pad column of the first chip.

15. The semiconductor package according to claim 13, wherein, in each of the first and second chips, the first and second level serializer-deserializers are disposed in a peripheral region including the second edge portion.

16. The semiconductor package according to claim 13, wherein each of the first and second chips further includes a power pad that is connected to the substrate through a bonding wire, and wherein, in each of the first and second chips, the power pad is included in the first pad column.

17. The semiconductor package according to claim 1, wherein each of the first and second chips includes a first pad column that is located in a first edge portion, and wherein, in each of the first and second chips, the first and second pads are included in the first pad column.

18. The semiconductor package according to claim 17, wherein the second chip is stacked on the first chip, and wherein the second chip is offset with respect to the first chip to expose the first pad column of the first chip.

19. The semiconductor package according to claim 17, wherein, in each of the first and second chips, the first and second level serializer-deserializers are disposed in a peripheral region including the first edge portion.

20. The semiconductor package according to claim 17, wherein each of the first and second chips further includes a power pad that is located in a second edge portion and is connected to the substrate through a bonding wire, and wherein the first edge portion and the second edge portion are on opposing sides of a corresponding chip.

21. A semiconductor package comprising:

a first chip disposed on a substrate, the first chip including an external data pad, a first slice data pad, and a first level serializer-deserializer connected between the external data pad and the first slice data pad;

a second chip stacked on the first chip, the second chip including a second slice data pad and a second level serializer-deserializer connected to the second slice data pad; and a first connection member connecting the first slice data pad and the second slice data pad;

wherein the first chip includes a first pad column and a second pad column that are located in a first edge portion;

wherein the first pad column is located between a side surface of the first chip included in the first edge portion and the second pad column; and wherein the external data pad is included in the first pad column, and the first slice data pad is included in the second pad column.

22. The semiconductor package according to claim 21, wherein the first connection member includes a bonding wire.

23. The semiconductor package according to claim 21, wherein the second chip includes a plurality of pad columns, and wherein the second slice data pad is included in an outermost pad column that is closest to a side surface of the second chip adjacent to the first edge portion of the first chip, among the plurality of pad columns.

24. The semiconductor package according to claim 21, wherein the second chip is offset with respect to the first chip to expose the first and second pad columns of the first chip.

25. The semiconductor package according to claim 21, wherein the first chip further includes a power pad that is connected to the substrate through a bonding wire, and wherein the power pad is included in the first pad column of the first chip.

26. The semiconductor package according to claim 21, wherein the number of the pad columns of the second chip is less than the number of the pad columns of the first chip.

27. The semiconductor package according to claim 21, wherein the second chip has a smaller width than the first chip.

28. The semiconductor package according to claim 21, wherein each of the first and second chips includes a first pad column that is located in a first edge portion and a second pad column that is located in a second edge portion, wherein the first edge portion and the second edge portion are on opposing sides of a corresponding chip, wherein the external data pad is included in the first pad column of the first chip, wherein the first slice data pad is included in the second pad column of the first chip, and wherein the second slice data pad is included in the second pad column of the second chip.

29. The semiconductor package according to claim 28, wherein the second chip is offset with respect to the first chip to expose the second pad column of the first chip.

30. The semiconductor package according to claim 28, wherein the first chip further includes a power pad, and wherein the power pad is included in the first pad column.

31. The semiconductor package according to claim 21, wherein each of the first chip and the second chip includes a first pad column that is located in a first edge portion, wherein the external data pad and the first slice data pad are included in the first pad column of the first chip, and wherein the second slice data pad is included in the first pad column of the second chip.

32. The semiconductor package according to claim 31, wherein the second chip is offset with respect to the first chip to expose the first pad column of the first chip.

33. The semiconductor package according to claim 31, wherein each of the first and second chips further includes a power pad:

wherein, in each of the first and second chips, the power pad is included in a second pad column that is located in a second edge portion; and wherein the first edge portion and the second edge portion are on opposing sides of a corresponding chip.

34. A semiconductor package comprising:

a substrate;

first and second chips stacked on the substrate, each including an external signal pad that is included in a first pad column located in a first edge portion and a slice signal pad that is included in a second pad column located in the first edge portion;

a first connection member connecting the slice signal pad of the first chip to the slice signal pad of the second chip; and a second connection member connecting the substrate to the external signal pad of the first chip, wherein, in each of the first and second chips, the first pad column is disposed between a chip side surface included in the first edge portion and the second pad column.

35. The semiconductor package according to claim 34, wherein the first and second connection members include bonding wires.

36. The semiconductor package according to claim 34, wherein each of the first and second chips includes a plurality of pad columns, and wherein the first pad column is a pad column that is closest to the chip side surface included in the first edge portion, among the plurality of pad columns, and the second pad column is a pad column that is close to the chip side surface included in the first edge portion, adjacent to the first pad column.

37. The semiconductor package according to claim 34, wherein the second chip is stacked on the first chip, and wherein the second chip is offset with respect to the first chip to expose the first and second pad columns of the first chip.

38. The semiconductor package according to claim 34, wherein the first connection member and the second connection member are disposed on opposing sides, respectively, of the first edge portion of the first chip.

39. The semiconductor package according to claim 34, wherein the external signal pad of the first chip contacts a bonding wire that is connected to the substrate, and wherein the external signal pad of the second chip does not contact a bonding wire that is connected to the substrate.

40. The semiconductor package according to claim 34, wherein each of the first and second chips includes a cell region and a peripheral region, and wherein, in each of the first and second chips, the first edge portion is included in the peripheral region, and the external signal pad and the slice signal pad are connected to a peripheral circuit that is disposed in the peripheral region.

41. The semiconductor package according to claim 34, wherein each of the first chip and the second chip further includes a power pad that is included in the first pad column, wherein the power pad of the first chip contacts a bonding wire that is connected to the substrate, and wherein the power pad of the second chip does not contact a bonding wire that is connected to the substrate.

42. The semiconductor package according to claim 34, wherein each of the first and second chips further includes a power pad that is located in a second edge portion, wherein the first edge portion and the second edge portion are on opposing sides of a corresponding chip, and wherein the power pad of the first chip and the power pad of the second chip are connected to the substrate through bonding wires, respectively.

43. A semiconductor package comprising:

a substrate;

a first chip stacked on the substrate, the first chip including an external signal pad that is included in a first pad column located in a first edge portion and a first slice signal pad that is included in a second pad column located in the first edge portion;

a second chip stacked on the first chip, the second chip including a second slice signal pad;

a first connection member connecting the first slice signal pad to the second slice signal pad; and a second connection member connecting the substrate to the external signal pad, wherein the first pad column is disposed between a side surface of the first chip included in the first edge portion and the second pad column.

44. The semiconductor package according to claim 43, wherein the first and second connection members include bonding wires.

45. The semiconductor package according to claim 43, wherein the second chip includes a plurality of pad columns, and wherein the second slice signal pad is included in an outermost pad column that is closest to a side surface of the second chip adjacent to the first edge portion of the first chip, among the plurality of pad columns.

46. The semiconductor package according to claim 43, wherein the second chip is offset with respect to the first chip to expose the first and second pad columns.

47. The semiconductor package according to claim 43, wherein the first connection member and the second connection member are disposed on opposing sides, respectively, of the first edge portion of the first chip.

48. The semiconductor package according to claim 43, wherein the first chip further includes a power pad that is connected to the substrate through a bonding wire.

49. The semiconductor package according to claim 48, wherein the power pad is included in the first pad column.

* * * * *